United States Patent
Nakamura

(10) Patent No.: US 9,929,105 B2
(45) Date of Patent: Mar. 27, 2018

(54) LEAKAGE LASER BEAM DETECTING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/611,380

(22) Filed: Jun. 1, 2017

(65) Prior Publication Data
US 2017/0352627 A1    Dec. 7, 2017

(30) Foreign Application Priority Data
Jun. 2, 2016    (JP) ................ 2016-110703

(51) Int. Cl.
| | | |
|---|---|---|
| H01L 21/00 | (2006.01) | |
| H01L 23/544 | (2006.01) | |
| G01J 1/42 | (2006.01) | |
| B23K 26/00 | (2014.01) | |
| B23K 26/53 | (2014.01) | |
| B23K 26/70 | (2014.01) | |
| H01L 21/683 | (2006.01) | |
| H01L 21/66 | (2006.01) | |
| B23K 103/00 | (2006.01) | |

(52) U.S. Cl.
CPC ........ *H01L 23/544* (2013.01); *B23K 26/0006* (2013.01); *B23K 26/0057* (2013.01); *B23K 26/53* (2015.10); *B23K 26/702* (2015.10); *G01J 1/42* (2013.01); *H01L 21/6836* (2013.01); *H01L 22/12* (2013.01); *B23K 2203/56* (2015.10); *H01L 2221/68386* (2013.01)

(58) Field of Classification Search
CPC ... H01L 23/544; H01L 21/6836; H01L 22/12; G01J 1/42; B23K 26/0006; B23K 26/0057; B23K 26/53; B23K 26/702
See application file for complete search history.

(56) References Cited

U.S. PATENT DOCUMENTS

2007/0135006 A1 * 6/2007 Michaels ................ A47L 13/17
442/69

FOREIGN PATENT DOCUMENTS

JP    2002-192370    7/2002

* cited by examiner

*Primary Examiner* — Richard Booth
(74) *Attorney, Agent, or Firm* — Greer Burns & Crain, Ltd.

(57) ABSTRACT

A leakage laser beam detecting method includes a coating step of coating the lower surface of a wafer with an oil marker, thereafter, a press-bonding step of press-bonding an adhesive tape to the lower surface of the wafer, thereafter, a modified layer forming step of applying a laser beam having a wavelength that can be transmitted through the wafer to the wafer from the upper surface thereof while making the laser beam be focused at a focused point within the wafer thereby to form modified layers in the wafer, thereafter, a peeling step of peeling off the press-bonded adhesive tape, and a leakage laser beam detecting step of detecting areas of the lower surface where the oil marker has been removed when the press-bonded adhesive tape is peeled off as areas marked by leakage laser beams.

4 Claims, 5 Drawing Sheets

LEAKAGE LASER BEAM DETECTING METHOD

BACKGROUND OF THE INVENTION

Field of the Invention

The present invention relates to a leakage laser beam detecting method of detecting a leakage laser beam that reaches the lower surface of a wafer when a laser beam having a wavelength that can be transmitted through the wafer is applied to the wafer from the upper surface thereof while being focused at a focused point within the wafer thereby to form modified layers in the wafer.

Description of the Related Art

Wafers with a plurality of devices such as integrated circuits (ICs), large scale integrations (LSIs), etc. formed on their surfaces in areas demarcated by projected dicing lines are divided into individual device chips by a dicing apparatus and a laser processing apparatus, and the divided device chips will be used in electric appliances such as mobile phones, personal computers, etc. The laser processing apparatus generally includes a chuck table for holding a wafer, laser applying means for applying a pulsed laser beam having a wavelength that can be transmitted through the wafer to the wafer held on the chuck table, and process-feeding means for process-feeding the chuck table and the laser applying means relatively to each other. The laser processing apparatus is capable of forming modified layers as starting points of division within the wafer which correspond to the projected dicing lines on the wafer (see, for example, Japanese Patent No. 3408805).

When the focused point of a laser beam is positioned within a wafer in alignment with the projected dicing line by applying the laser beam from the face side of the wafer where the devices are formed, the devices on the face side of the wafer are irradiated and damaged by part of the laser beam, and the laser beam is irregularly reflected by the irregularities on the projected dicing lines. Therefore, it is general practice to apply the laser beam to the wafer from the reverse side thereof to form the modified layers within the wafer.

SUMMARY OF THE INVENTION

According to the laser processing process for forming modified layers within a wafer with the laser processing apparatus, most of the energy of the laser beam applied to the reverse side of the wafer is used to form the modified layers. However, depending on the selected wavelength and laser output power, and other processing conditions, part of the applied laser beam may leak as a leakage laser beam and reach the face side of the wafer. If the laser beam applied to the reverse side of the wafer travels straight in the wafer and leaks onto the projected dicing lines on the face side of the wafer, then no particular problem arises. However, the laser beam focused at the focused point within the wafer may be refracted or reflected by previously formed modified layers or cracks extending from those modified layers, and led to travel in random directions, possibly reaching and causing damage to devices disposed along the projected dicing lines. Consequently, for forming modified layers within a wafer by applying a laser beam thereto, it is necessary to verify in advance processing conditions under which the leakage laser beam adversely affects the devices and to make settings to avoid those processing conditions as much as possible. Heretofore, it has been impossible to easily grasp how the leakage laser beam is generated.

It is therefore an object of the present invention to provide a leakage laser beam detecting method of easily detecting a leakage laser beam that reaches the lower surface of a wafer when a laser beam having a wavelength that can be transmitted through the wafer is applied to the wafer from the upper surface thereof while being focused at a focused point within the wafer thereby to form modified layers in the wafer.

In accordance with an aspect of the present invention, there is provided a leakage laser beam detecting method of detecting a leakage laser beam that reaches the lower surface of a wafer when a laser beam having a wavelength transmissive through the wafer is applied to the wafer from the upper surface thereof while being focused at a focused point within the wafer thereby to form modified layers in the wafer, the leakage laser beam detecting method including a coating step of coating the lower surface of the wafer with an oil marker, after performing the coating step, a press-bonding step of press-bonding an adhesive tape to the lower surface of the wafer, after performing the press-bonding step, a modified layer forming step of applying a laser beam having a wavelength that can be transmitted through the wafer to the wafer from the upper surface thereof while making the laser beam be focused at a focused point within the wafer thereby to form modified layers in the wafer, after performing the modified layer forming step, a peeling step of peeling off the press-bonded adhesive tape, and a leakage laser beam detecting step of detecting areas of the lower surface where the oil marker has been removed when the press-bonded adhesive tape is peeled off as areas marked by leakage laser beams.

In accordance with another aspect of the present invention, there is provided a leakage laser beam detecting method of detecting a leakage laser beam that reaches the lower surface of a wafer when a laser beam having a wavelength transmissive through the wafer is applied to the wafer from the upper surface thereof while being focused at a focused point within the wafer thereby to form modified layers in the wafer, the leakage laser beam detecting method including a coating step of coating the lower surface of the wafer with an oil marker, after performing the coating step, a modified layer forming step of applying a laser beam having a wavelength that can be transmitted through the wafer to the wafer from the upper surface thereof while making the laser beam be focused at a focused point within the wafer thereby to form modified layers in the wafer, after performing the modified layer forming step, a press-bonding step of press-bonding an adhesive tape to the lower surface of the wafer, a peeling step of peeling off the press-bonded adhesive tape, and a leakage laser beam detecting step of detecting areas of the lower surface where the oil marker has been removed when the press-bonded adhesive tape is peeled off as areas marked by leakage laser beams.

The oil marker used in the coating step may preferably be black in color. The adhesive tape may preferably include an adhesive layer that is curable by the application of an ultraviolet radiation to the adhesive tape in the press-bonding step, and the press-bonded adhesive tape should preferably be peeled off after an ultraviolet radiation has been applied to the adhesive tape to cure the adhesive layer in the peeling step.

According to the present invention, when a laser beam having a wavelength that can be transmitted through a wafer is applied to the wafer from the upper surface thereof while being focused at a focused point within the wafer thereby to form modified layers in the wafer, marks of leakage laser beams that reach the lower surface of the wafer can easily be detected. Consequently, it is possible to find laser processing conditions which may be responsible for generating leakage laser beams that tend to cause damage to devices on the wafer and also possible to sort out various laser processing conditions that can avoid damage to devices on the wafer as much as possible.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
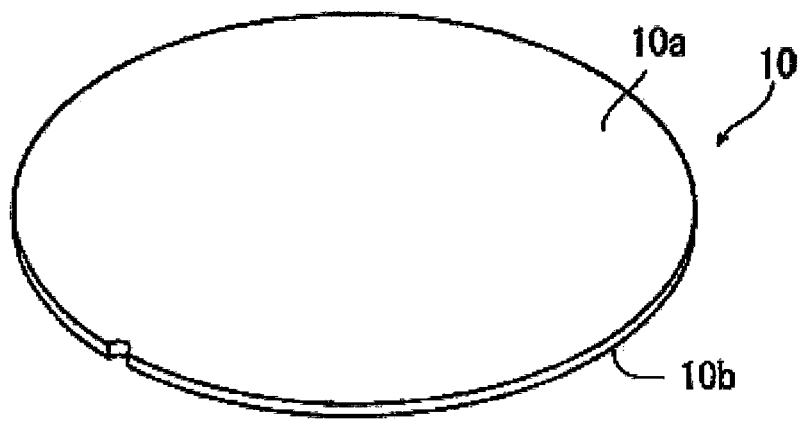
FIG. 1A is a perspective view of a dummy wafer.

A leakage laser beam detecting method according to a first embodiment of the present invention will first be described in detail below with reference to the attached drawings. FIG. 1A shows in perspective a dummy wafer 10 for use in the leakage laser beam detecting method according to the present invention. The dummy wafer 10 is made of a material identical to the material of those wafers to be actually processed, and a silicon (Si) wafer, for example, may be chosen as the dummy wafer 10. The dummy wafer 10 is free of any devices on its upper surface 10a and a lower surface 10b. However, devices are assumed to have been formed on the lower surface 10b, and the upper surface 10a to be irradiated with a laser beam has been polished. The material of the dummy wafer 10 according to the present invention is not limited to silicon (Si), but may be a material, selected from sapphire, silicon carbide (SiC), etc., for example, which is capable of forming modified layers within the wafer when irradiated with a laser beam having a wavelength that can be transmitted through the wafer. If a wafer that is supposed to have modified layers formed therein by laser processing is not to be polished, then it is not necessary to distinguish between its upper and lower surfaces, and either one of the surfaces of the wafer may be regarded as an upper surface or a lower surface.

Figure 1B:
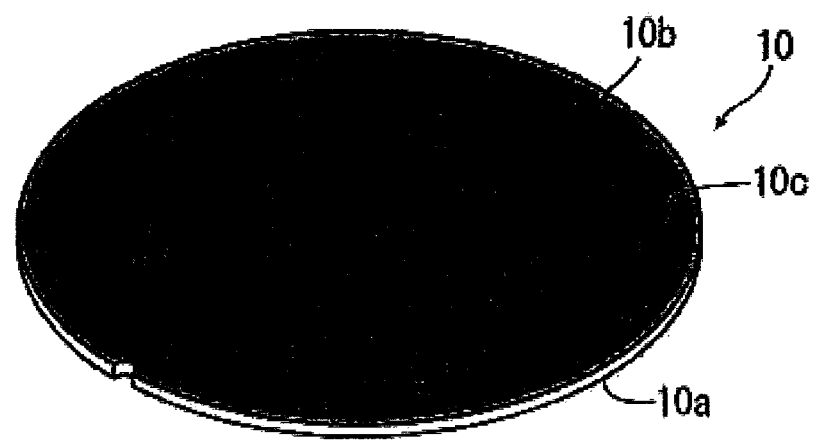
FIG. 1B is a perspective view of the dummy wafer shown in FIG. 1A, illustrated as turned upside down.

After the dummy wafer 10 has been prepared, as shown in FIG. 1B, a coating step is carried out on the lower surface 10b of the dummy wafer 10. Specifically, the lower surface 10b of the dummy wafer 10 is coated with an oil marker and then dried into a coated surface 10c. Known oil markers include a quick-drying ink made of an organic solvent (alcoholic, aromatic, aliphatic or the like) with an oil-soluble dye and a resin dissolved therein, and an ink made of the same materials as described above except that a pigment is used instead of the oil-soluble dye. According to the present embodiment, a quick-drying ink made of an organic solvent with an oil-soluble dye and a resin dissolved therein is selected as the oil marker and applied to the lower surface 10b of the dummy wafer 10. Though the selected oil-soluble dye is not restricted to any color in particular, a black ink is preferable because it facilitates the detection of a leakage laser beam to be described later.

Figure 2:
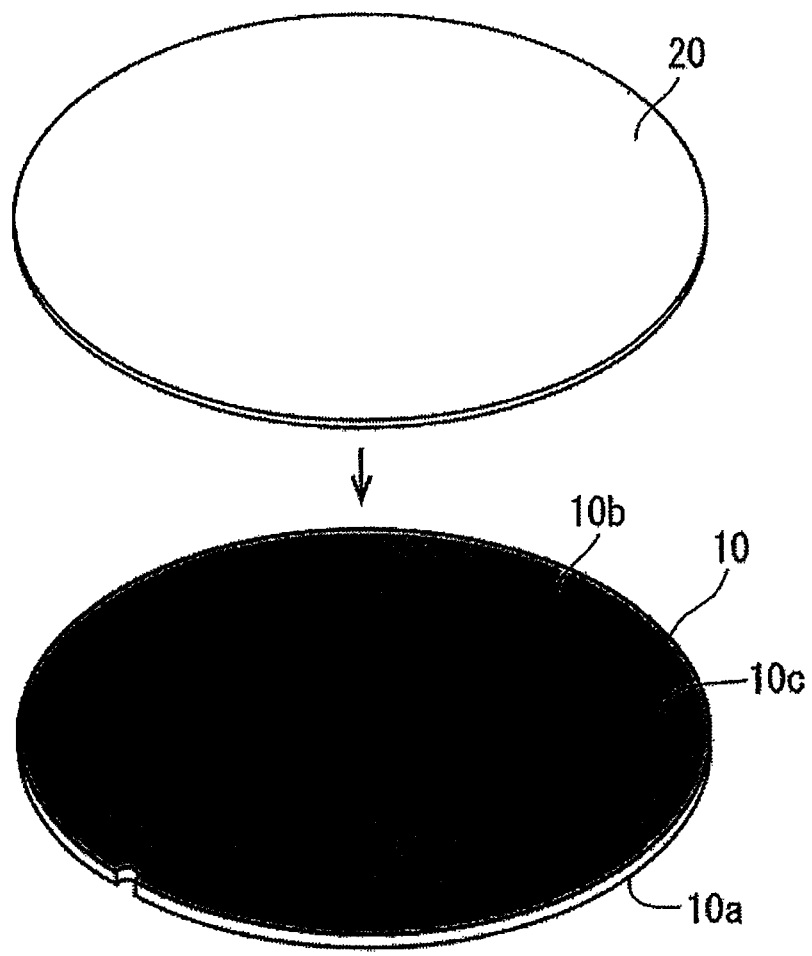
FIG. 2 is a perspective view showing a press-bonding step for an adhesive tape according to a first embodiment of the present invention.

After the coating step has been performed on the dummy wafer 10, a press-bonding step is carried out thereon. In the press-bonding step, as shown in FIG. 2, an adhesive tape 20 is press-bonded to the lower surface 10b of the dummy wafer 10, i.e., the surface which has been coated to form the coated surface 10c. The adhesive tape 20 includes an ultraviolet-curable dicing tape including an adhesive layer that is curable by the application of an ultraviolet radiation to the adhesive tape 20. The ultraviolet-curable dicing tape may be selected from a polyvinyl chloride (PVC) tape and a polyolefin (PO) tape, for example. Though an ultraviolet-curable dicing tape is used as the adhesive tape in the present embodiment, the present invention may not necessarily be limited to such a tape, but other adhesive tapes may also be used. For example, an adhesive tape that is cured by the application of an external force, e.g., an adhesive tape made of a thermosetting resin, or an adhesive tape that is not cured by the application of an external force may be selected. However, an adhesive tape that is cured by the application of an external force is more advantageous for excellent handleability because its adhesive power is lowered when an external force is applied.

Figure 3:
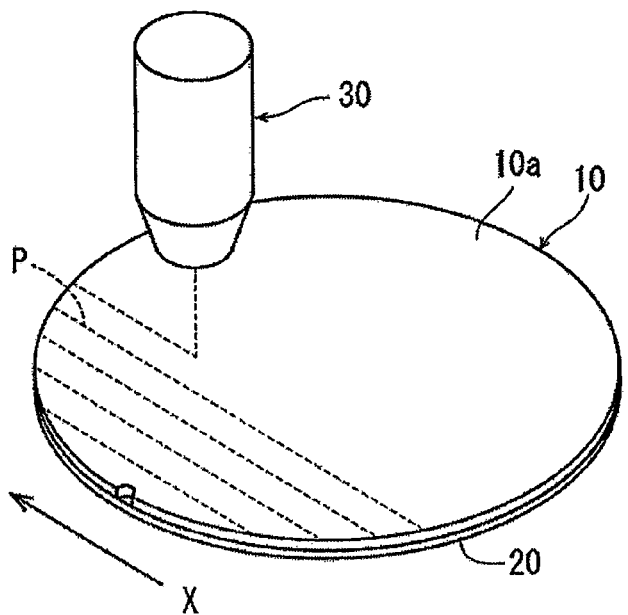
FIG. 3 is a perspective view showing a modified layer forming step according to the first embodiment of the present invention.

The press-bonding step is followed by a modified layer forming step. In the modified layer forming step, as shown in FIG. 3, a laser processing apparatus 30, whose entire makeup is omitted from illustration for the sake of brevity, applies a laser beam having a wavelength that can be transmitted through the material of the dummy wafer 10 to the dummy wafer 10 from the upper surface 10a thereof while making the laser beam be focused at a focused point within the dummy wafer 10, while the position where the laser beam is applied and the dummy wafer 10 are moved relatively to each other in the direction indicated by the arrow X, thereby forming modified layers P in the dummy wafer 10. The modified layers P are formed all over the dummy wafer 10. However, since the modified layers P are used to verify a leakage laser beam, the distance between adjacent ones of the modified layers P is larger than the distance between adjacent ones of the paths scanned by a laser beam applied to actual wafers with devices formed thereon to divide them into individual device chips.

Laser processing conditions for the modified layer forming step are determined in view of processing conditions under which actual wafers are supposed to be processed by a laser beam. For example, the modified layer forming step is carried out under the following laser processing conditions:

Laser wavelength: 1342 nm
Repetitive frequency: 90 kHz
Average output power: 1.9 W
Spot diameter: 1 µm
Process-feeding speed: 700 mm/second
Wafer thickness: 775 µm
Position of focused point: 700 µm from the upper surface of the wafer (75 µm from the lower surface)

Figure 4:
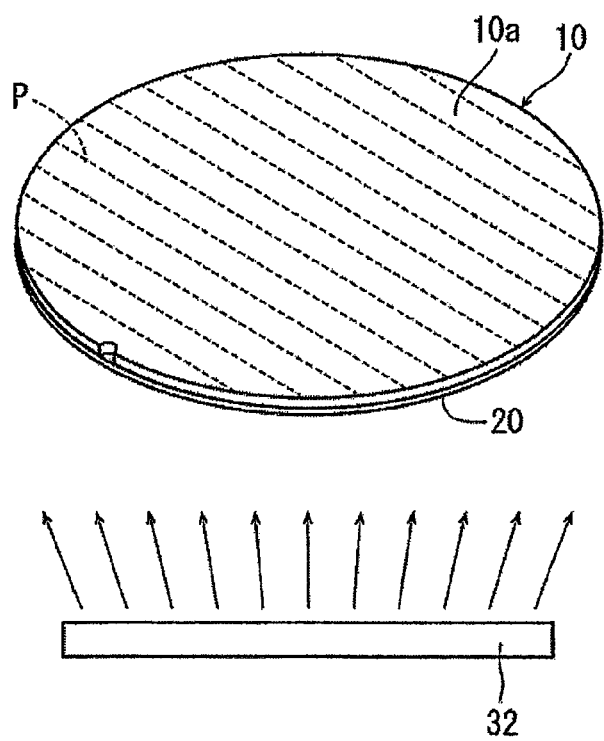
FIG. 4 is a perspective view showing an ultraviolet radiation applying step according to the first embodiment of the present invention.

After the modified layer forming step has been carried out, a peeling step is performed to peel off the adhesive tape 20. Specifically, as shown in FIG. 4, ultraviolet radiation applying means 32 is energized to apply an ultraviolet radiation to the lower surface 10b of the dummy wafer 10 to which the adhesive tape 20 has been press-bonded (ultraviolet radiation applying step). The application of the ultraviolet radiation cures the adhesive tape 20, lowering its adhesive power with respect to the dummy wafer 10. Then, as shown in FIG. 5, the adhesive tape 20 with the lowered adhesive power is peeled off the lower surface 10b of the dummy wafer 10 (peeling step).

Figure 5:
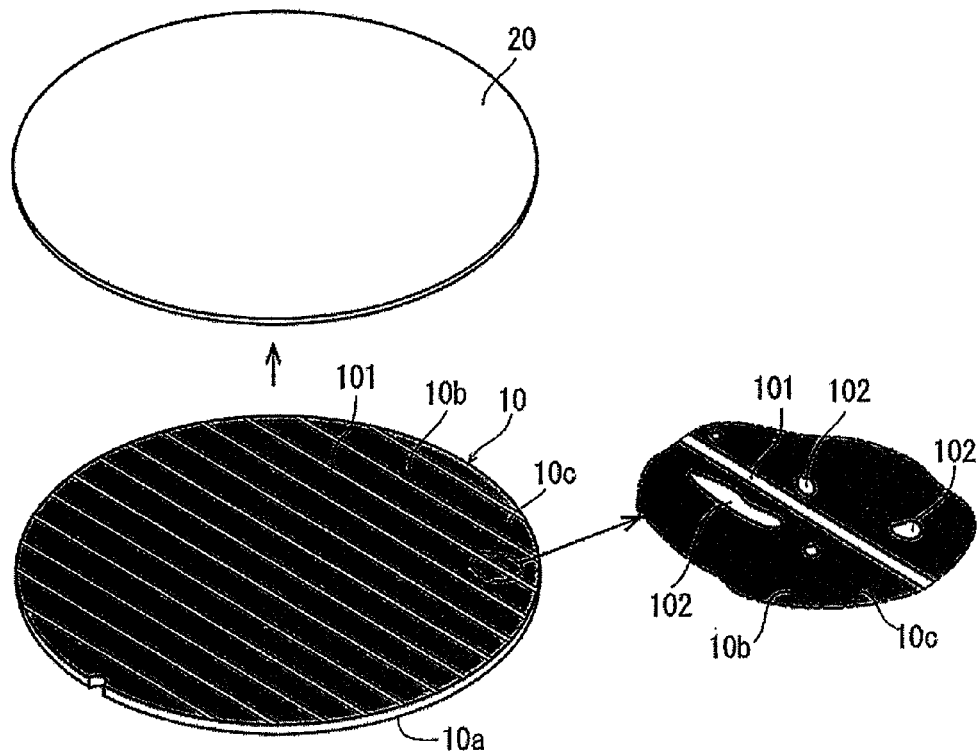
FIG. 5 is a perspective view illustrating a peeling step and a leakage laser beam detecting step according to the first embodiment and a second embodiment of the present invention.

FIG. 5 also includes an enlarged fragmentary representation of the lower surface 10b of the dummy wafer 10 from which the adhesive tape 20 has been peeled off in the peeling step. The enlarged fragmentary representation shows leakage laser beam marks 101 and 102 where parts of the coated surface 10c have been removed in the peeling step. The leakage laser beam mark 101, which is indicated as a straight mark, represents a mark produced by a laser beam applied to form a modified layer P and having reached the lower surface 10b of the dummy wafer 10. The position of the leakage laser beam mark 101 is aligned with the position of a projected dicing line on actual wafers, and hence the leakage laser beam mark 101 does not adversely affect the quality of the wafers. On the other hand, the leakage laser beam marks 102 which are formed around the straight leakage laser beam mark 101 and which have irregular shapes represent marks of leakage laser beams which tend to deviate from projected dicing lines and reach areas where devices are formed on actual wafers. The operator who carries out the leakage laser beam detecting method to detect the adverse effects of leakage laser beams in the laser processing process for forming modified layers in wafers peels off the adhesive tape 20 to make the leakage laser beam marks 101 and 102 appear and detects the adverse effects of leakage laser beams (leakage laser beam detecting step). The leakage laser beam marks 101 and 102 are considered to appear for the following reasons.

After lower surface 10b of the dummy wafer 10 has been coated with the oil marker, if the adhesive tape 20 is press-bonded to the coated surface 10c and then the peeling step is carried out without the application of a laser beam, then the coated surface 10c is not peeled off. This is because the ink of the applied oil marker is dried and firmly fixed to the lower surface 10b of the dummy wafer 10. However, according to the first embodiment of the present invention, when a leakage laser beam which has not contributed to the formation of a modified layer reaches the lower surface 10b, the energy of the leakage laser beam modifies the ink of the oil marker on the lower surface 10b of the dummy wafer 10. When the coated surface 10c fixed to the lower surface 10b is modified by the leakage laser beam that has reached the coated surface 10c, the areas thereof modified by the leakage laser beam are brought into a state where they can easily be peeled off from the lower surface 10b of the dummy wafer 10. When the adhesive tape 20 is subsequently peeled off in the peeling step, the modified areas are also peeled off with the adhesive tape 20, forming the leakage laser beam marks 101 and 102.

A leakage laser beam detecting method according to a second embodiment of the present invention will now be described in detail below with reference to the attached drawings. Only details of the second embodiment which are different from those of the first embodiment will mainly be described below, with other details briefly touched upon.

Figure 6:
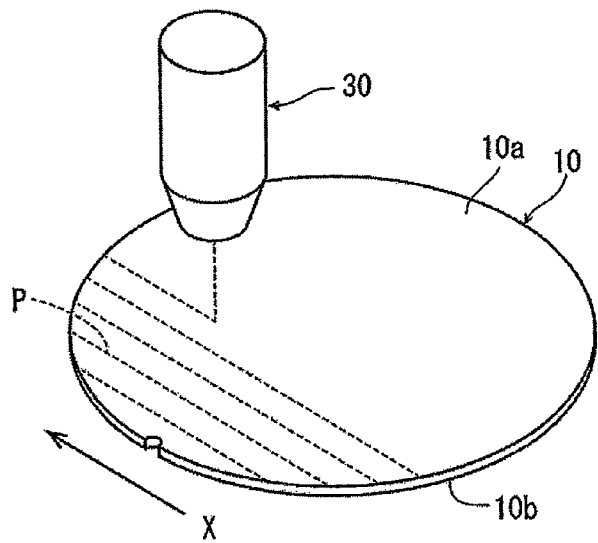
FIG. 6 is a perspective view showing a modified layer forming step according to the second embodiment of the present invention.

According to the second embodiment, as with the first embodiment, a dummy wafer 10 of silicon (Si) is prepared, and the coating step is carried out on the lower surface 10b thereof, forming a coated surface 10c (see FIGS. 1A and 1B). After the coating step has been carried out, a modified layer forming step is performed on the dummy wafer 10, as shown in FIG. 6, before an adhesive tape is press-bonded. Specifically, a laser processing apparatus 30, whose entire makeup is omitted from illustration for the sake of brevity, applies a laser beam having a wavelength that can be transmitted through the material of the dummy wafer 10 to the dummy wafer 10 from the upper surface 10a thereof while making the laser beam be focused at a focused point within the dummy wafer 10, while the position where the laser beam is applied and the dummy wafer 10 are moved relatively to each other in the direction indicated by the arrow X, thereby forming modified layers P in the dummy wafer 10. The modified layer forming step is carried out under the same laser processing conditions as those according to the first embodiment.

Figure 7:
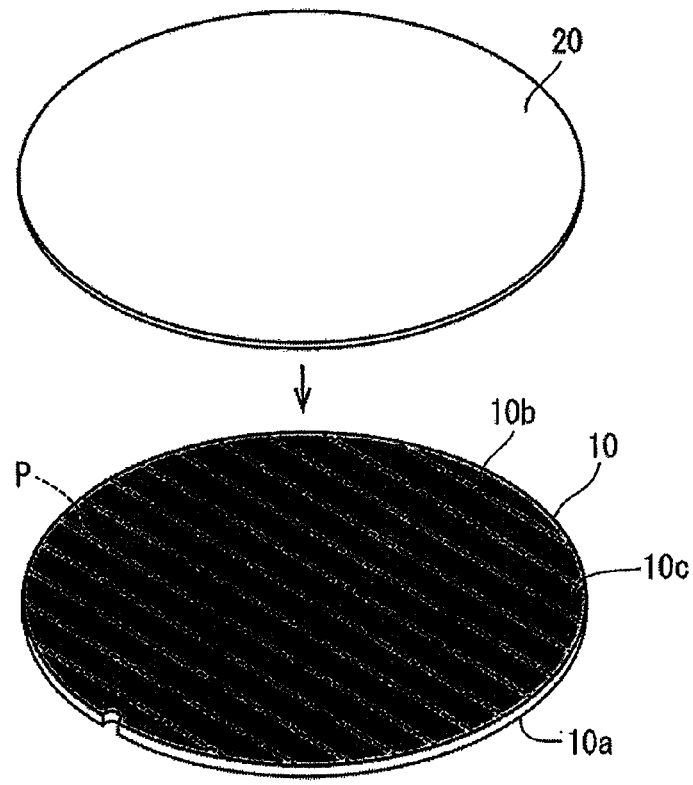
FIG. 7 is a perspective view showing a press-bonding step for an adhesive tape according to the second embodiment of the present invention.
Figure 8:
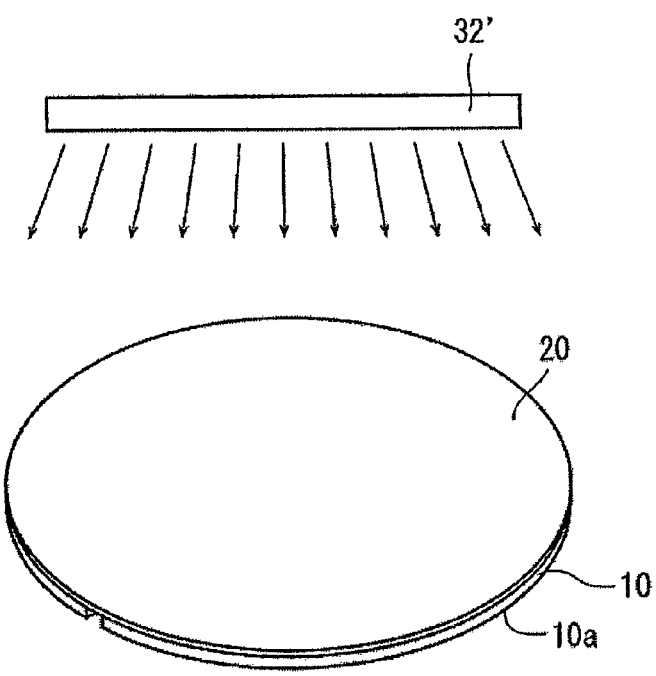
FIG. 8 is a perspective view showing an ultraviolet radiation applying step according to the second embodiment of the present invention.

After the modified layer forming step has been performed on the dummy wafer 10, as shown in FIG. 7, a press-bonding step is carried out thereon to press-bond an adhesive tape 20 to the lower surface 10b of the dummy wafer 10 which has been coated to form the coated surface 10c. After the press-bonding step has been carried out, as shown in FIG. 8, ultraviolet radiation applying means 32' is energized to apply an ultraviolet radiation to the lower surface 10b of the dummy wafer 10 to which the adhesive tape 20 has been press-bonded (ultraviolet radiation applying step) in preparation for a peeling step. The application of the ultraviolet radiation cures the adhesive tape 20, lowering its adhesive power with respect to the dummy wafer 10. Then, as is the case with the peeling step and the leakage laser beam detecting step according to the first embodiment shown in FIG. 5, the adhesive tape 20 with the lowered adhesive power is peeled off the lower surface 10b of the dummy wafer 10 (peeling step), and the operator who detects the adverse effects of leakage laser beams in the laser processing process for forming modified layers in wafers peels off the adhesive tape 20 to make the leakage laser beam marks 101 and 102 exposed and detects the adverse effects of leakage laser beams (leakage laser beam detecting step).

With the leakage laser beam detecting method of each of the illustrated embodiments according to the present invention, when a laser beam having a wavelength that can be transmitted through a wafer is applied to the wafer from the upper surface thereof while being focused at a focused point within the wafer thereby to form modified layers in the wafer, marks of leakage laser beams that reach the lower surface of the wafer can easily be detected. Consequently, in a laser processing process for forming modified layers as starting points of division within the wafer, laser processing conditions which may be responsible for causing damage to devices on the wafer can easily be found, and hence can quickly be dealt with appropriately.

In both first and second embodiments, a dummy wafer is used to detect leakage laser beams. However, the present invention is not limited to the use of a dummy wafer. The principles of present invention are also applicable to the detection of leakage laser beams on an outer peripheral region, free of devices, of an actual wafer which surrounds an area where a plurality of actual devices are formed. According to such a modification, since the adverse effects of leakage laser beams can be detected on an actual wafer that is to be processed to form modified layers therein and divided into individual device chips, the adverse effects of leakage laser beams can be verified in a manner closer to reality, allowing more suitable laser processing conditions to be established.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A leakage laser beam detecting method of detecting a leakage laser beam that reaches a lower surface of a wafer when a laser beam having a wavelength transmissive through the wafer is applied to the wafer from an upper surface thereof while being focused at a focused point within the wafer thereby to form modified layers in the wafer, the leakage laser beam detecting method comprising:
    a coating step of coating the lower surface of the wafer with an oil marker;
    after performing the coating step, a press-bonding step of press-bonding an adhesive tape to the lower surface of the wafer;
    after performing the press-bonding step, a modified layer forming step of applying a laser beam having a wavelength that can be transmitted through the wafer to the wafer from the upper surface thereof while making the laser beam be focused at a focused point within the wafer thereby to form modified layers in the wafer;
    after performing the modified layer forming step, a peeling step of peeling off the press-bonded adhesive tape; and
    a leakage laser beam detecting step of detecting areas of the lower surface where the oil marker has been removed when the press-bonded adhesive tape is peeled off as areas marked by leakage laser beams.

2. A leakage laser beam detecting method of detecting a leakage laser beam that reaches a lower surface of a wafer when a laser beam having a wavelength transmissive through the wafer is applied to the wafer from an upper surface thereof while being focused at a focused point within the wafer thereby to form modified layers in the wafer, the leakage laser beam detecting method comprising:
    a coating step of coating the lower surface of the wafer with an oil marker;
    after performing the coating step, a modified layer forming step of applying a laser beam having a wavelength that can be transmitted through the wafer to the wafer from the upper surface thereof while making the laser beam be focused at a focused point within the wafer thereby to form modified layers in the wafer;
    after performing the modified layer forming step, a press-bonding step of press-bonding an adhesive tape to the lower surface of the wafer;
    a peeling step of peeling off the press-bonded adhesive tape; and
    a leakage laser beam detecting step of detecting areas of the lower surface where the oil marker has been removed when the press-bonded adhesive tape is peeled off as areas marked by leakage laser beams.

3. The leakage laser beam detecting method according to claim 1, wherein said oil marker used in said coating step is black in color.

4. The leakage laser beam detecting method according to claim 1, wherein said adhesive tape includes an adhesive layer that is curable by the application of an ultraviolet radiation to the adhesive tape in said press-bonding step, and the press-bonded adhesive tape is peeled off after an ultraviolet radiation has been applied to the adhesive tape to cure the adhesive layer in said peeling step.

* * * * *